United States Patent [19]

McMahon

[11] Patent Number: 5,757,690
[45] Date of Patent: May 26, 1998

[54] EMBEDDED ROM WITH RAM VALID BITS FOR FETCHING ROM-CODE UPDATES FROM EXTERNAL MEMORY

[75] Inventor: Scott H. R. McMahon, Austin, Tex.

[73] Assignee: Exponential Technology, Inc., San Jose, Calif.

[21] Appl. No.: 842,007

[22] Filed: Apr. 23, 1997

[51] Int. Cl.[6] .................................................. G11C 17/00
[52] U.S. Cl. ............... 365/104; 365/189.01; 365/189.02; 365/207
[58] Field of Search ..................... 365/104, 189.02, 365/189.01, 207

[56] References Cited

U.S. PATENT DOCUMENTS

| | | | |
|---|---|---|---|
| 4,400,798 | 8/1983 | Francis et al. | 365/174 |
| 4,610,000 | 9/1986 | Lee | 365/189 |
| 4,802,119 | 1/1989 | Heene et al. | 364/900 |
| 5,321,828 | 6/1994 | Phillips et al. | 395/500 |
| 5,481,713 | 1/1996 | Wetmore et al. | 395/700 |
| 5,487,037 | 1/1996 | Lee | 365/189.11 |
| 5,493,674 | 2/1996 | Mizutani et al. | 395/182.04 |
| 5,546,586 | 8/1996 | Wetmore et al. | 395/700 |
| 5,619,698 | 4/1997 | Lillich et al. | 395/710 |
| 5,623,665 | 4/1997 | Shimada | 395/182.03 |

Primary Examiner—David C. Nelms
Assistant Examiner—Hien Nguyen
Attorney, Agent, or Firm—Stuart T. Auvinen

[57] ABSTRACT

An embedded ROM has a column of static RAM cells attached to the end of the row lines. When a row of ROM cells is activated by the row line, a RAM cell is also activated by the row line. The RAM cell indicates if the data in the selected row's ROM cells is valid. When the RAM cell indicates that the ROM data is not valid, external memory is read to obtain a patched instruction and the ROM data is ignored. The ROM's base address is translated to a base address in external memory of patch code. The ROM's offset address is used as the offset into the patch-code region of external memory. Thus address translation is minimal as the offset is not translated. A single ROM instruction can be updated by a single patch instruction in external memory, providing fine granularity of code updates. Longer update routines can be located in a patch-code overflow region of external memory. The updated instruction at the ROM's offset in the patch-code region can be a jump instruction to the longer update routine in the overflow region. Thus both single and multiple-instruction patches are possible.

20 Claims, 5 Drawing Sheets

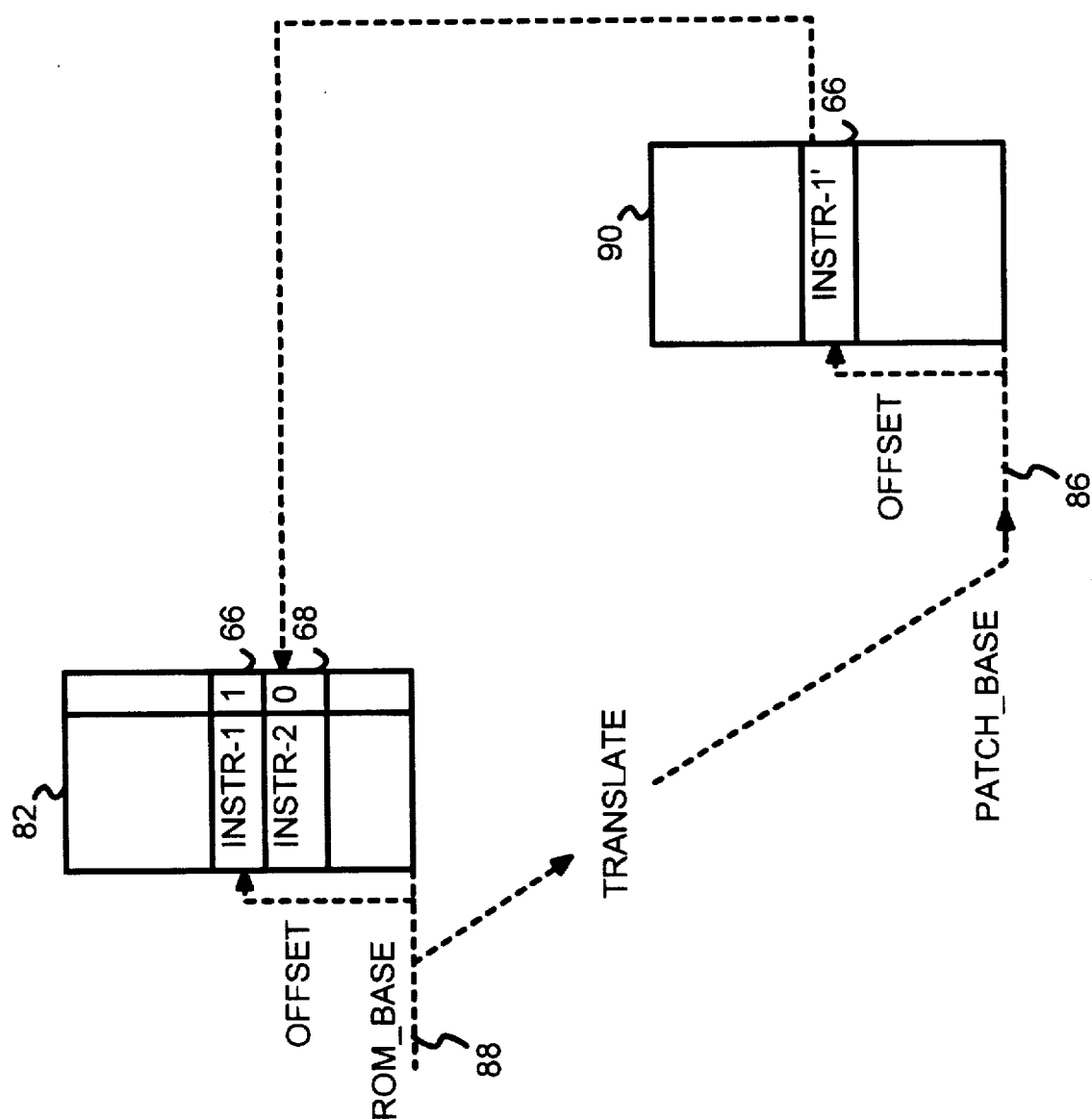

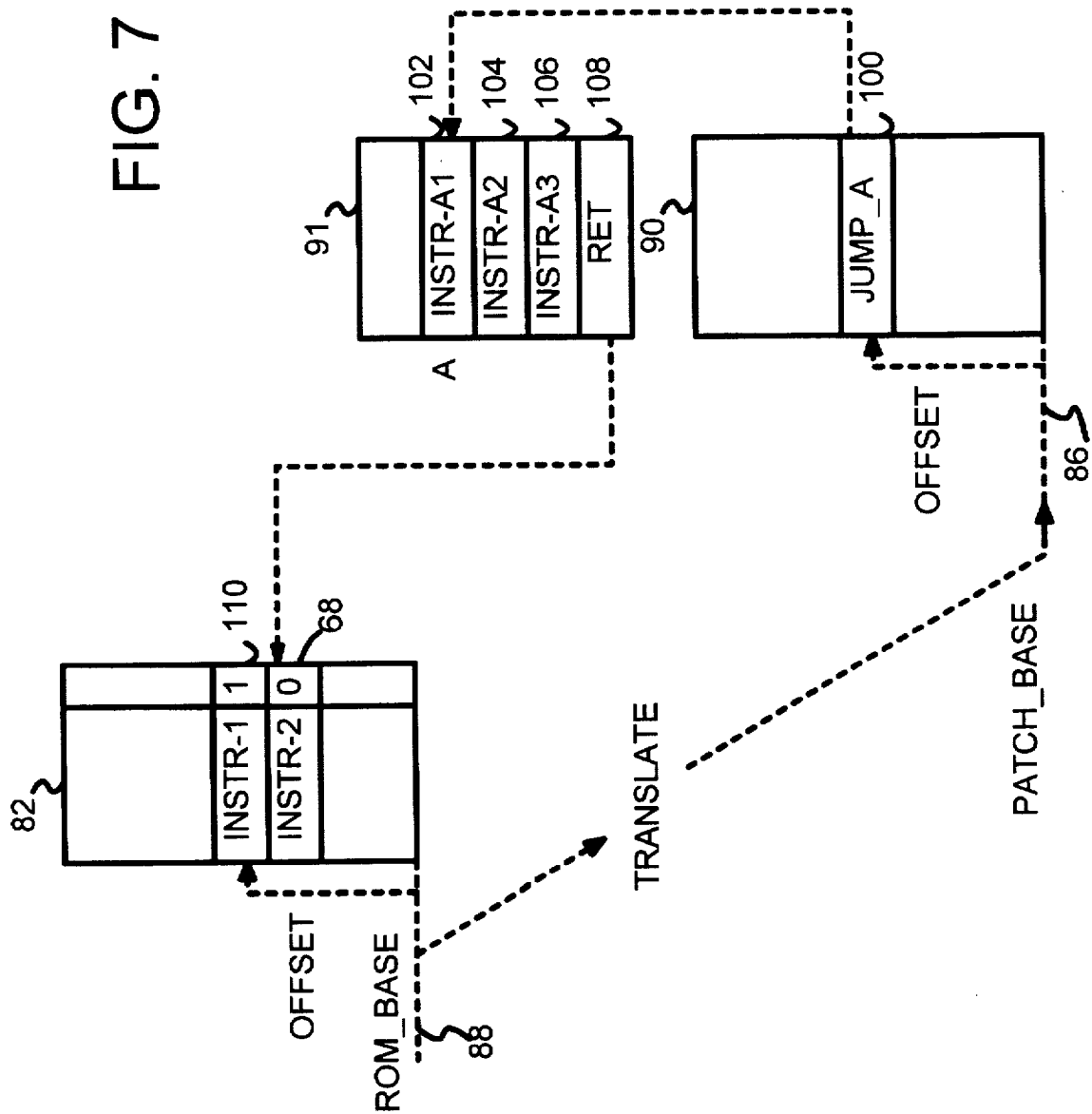

EMBEDDED ROM WITH RAM VALID BITS FOR FETCHING ROM-CODE UPDATES FROM EXTERNAL MEMORY

BACKGROUND OF THE INVENTION—FIELD OF THE INVENTION

This invention relates to embedded memories, and more particularly to patching of embedded ROMs.

BACKGROUND OF THE INVENTION— DESCRIPTION OF THE RELATED ART

Complex routines of instructions are used to control today's computers. Software application programs often use or call lower-level routines in an operating system (O/S). The operating system may itself call hardware-specific routines, which are part of a basic input-output system (BIOS). The BIOS is usually contained in a read-only memory such as a ROM. Microcode containing low-level operations to execute a machine instruction often resides inside a microprocessor. Emulation code to emulate complex instructions may likewise reside inside a microprocessor in an embedded ROM.

The complexity of software or firmware makes it difficult to write fully functional code. Modifications to fix errors of bugs are common. Additional functionality may be inserted into the code. Thus changes to code are common. While it is relatively easy and inexpensive to modify software, firmware such as code in a ROM is more difficult to change. A new ROM chip may be required to change the firmware code. For an embedded ROM, an entirely new microprocessor chip is manufactured for a code update. Re-manufacturing a microprocessor chip for even a minor code update can cost over a hundred thousand dollars.

Various solutions have been developed to solve the problem of code updates for read-only memories. Erasable-Programmable ROMs such as EEPROMs or flash EPROMs have been developed to allow re-programming. While flash EPROMs are useful, they require specialized transistor technology such as quantum-mechanical tunneling oxides and floating polysilicon gates. Microprocessors are not usually manufactured on such a complex EPROM process; thus flash memory is not an option for an embedded ROM.

Standard ROMs can be used together with an external random-access memory (RAM) to allow code updates. The updated code is loaded from a boot disk to the RAM, which is typically a portion of the main memory DRAM. However, the original, unmodified code in the ROM must somehow pass control over to the updated code in the RAM. One technique is to insert a jump instruction in the original ROM code. This jump instruction causes a jump to a code segment in RAM. The code segment in RAM can then be modified without changing the ROM code. This technique is useful for adjusting time delays, and is described in more detail by Mizutani et al. in U.S. Pat. No. 5,493,674. However, the original code must contain and use the jump, and a RAM routine must always be present. A danger is that a misbehaving application program could corrupt the RAM routine and crash the system.

A more versatile approach is to store a vector table of jump or interrupt vectors in RAM. Each routine in the ROM is entered through the vector table. A routine in the ROM can be replaced by changing the vector in the vector table to point to an updated routine in RAM rather than the original routine in ROM. Thus the original ROM code can be bypassed using the vector table. See Wetmore et al. in U.S. Pat. No. 5,546,586 and U.S. Pat. No. 5,481,713.

Techniques using a vector table in RAM require inserting jump instructions to the vector table in external RAM, even for the original ROM code when no changes have yet been made. It is undesirable to require that all routines be entered through the external vector table. An entire routine must be replaced with an updated routine in external RAM even when only one instruction is changed. Small changes still require that the entire routine be replaced. Since many routines are large, much memory space is needed for even minor changes. Finer granularity for minor updates is desired.

Locating the ROM code's interrupt or vector table in RAM is dangerous since RAM can be modified. A misbehaving program that writes outside of its address space could corrupt the vector table, rendering the ROM code unusable.

A hybrid RAM-ROM device is disclosed by Lee in U.S. Pat. No. 5,487,037, assigned to Dallas Semiconductor Corp. Fuses are added to SRAM cells. The device initially acts as a RAM. Later, the user can blow the fuses to change the device to a ROM. Unfortunately, fuses are not part of a standard microprocessor process and increase the size of the memory cells. Once the fuses are blown, updating code is no longer possible. Thus the device is not useful for ROM-based code updates.

What is desired is a patchable ROM. It is desired to update as little as one instruction in the ROM without replacing an entire routine. Fine patch granularity is desired. It is desirable to update ROM code without adding jump instructions to the ROM code, and without locating a vector table in RAM. It is desirable to locate the ROM vector table in read-only memory to prevent corruption. The amount of patch code in the vulnerable RAM is desired to be minimized to reduce the possibility of corruption. It is further desired to use a standard logic process without EPROM transistors or fuses.

SUMMARY OF THE INVENTION

An embedded memory has a plurality of read-only memory (ROM) bit lines and a pair of random-access-memory (RAM) bit lines. Each row line in a plurality of row lines is coupled to a plurality of ROM cells. Each row line is also coupled to a RAM cell. The RAM cell is readable and writeable, but the ROM cells are readable but not writeable.

A row decoder receives an address offset and decodes the address offset to select and activate a selected row line in the plurality or row lines. A plurality of ROM sense amplifiers outputs a ROM code word. Each ROM sense amplifier receives one of the ROM bit lines as an input and outputs a bit in the ROM code word. A differential sense amplifier is coupled to amplify a small voltage difference across the pair of RAM bit lines. The differential sense amplifier outputs a patch-enable signal indicating that the ROM code word has been patched and is not valid.

Thus each row line is connected to both ROM cells and a RAM cell. The RAM cell indicates when the ROM cells contain an invalid ROM code word.

In further aspects of the invention, a ROM cell is located at each intersection of a ROM bit line and a row line. A RAM cell is located at each intersection of the pair of RAM bit lines and a row line. Each ROM cell is manufactured either with or without a functional ROM transistor. The ROM transistor has a gate connected to a row line and a drain connected to a ROM bit line and a source connected to a constant-voltage supply. Thus ROM cells are programmed at manufacture by the presence or absence of the functional ROM transistor.

In still further aspects the constant-voltage supply is ground, the ROM transistor is an n-channel metal-oxide semiconductor (MOS) transistor, and the selected row line is activated by the row decoder driving a high voltage onto the selected row line to enable functional ROM transistors to conduct current from the ROM bit lines to ground.

In further aspects each ROM cell and each ROM sense amplifier connect to only one ROM bit line. Thus ROM sensing is single-ended while RAM sensing is differential.

In further aspects of the invention an external-memory interface is responsive to the patch-enable signal from the differential sense amplifier. It fetches an updated code word from an external memory when the patch-enable signal indicates that the ROM code word is not valid. Thus the updated code word is fetched from the external memory when the RAM cell indicates that the ROM code word is not valid.

BRIEF DESCRIPTION OF THE DRAWINGS

FIG. 6 is a diagram of fetching a single patched ROM word from external RAM.

FIG. 7 is a diagram of fetching multiple instructions from external RAM for a single instruction in ROM.

DETAILED DESCRIPTION

The present invention relates to an improvement in patchable read-only memories. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that fine granularity of code patches can be achieved if individual instruction words in a ROM can be invalidated. Since ROM memory cells cannot be modified, a RAM cell is used to store an invalidate bit. When an instruction word in the ROM is updated, a RAM cell associated with the instruction word is set to indicate that the instruction is not valid. An updated instruction word in an external RAM is instead fetched and executed before the following instruction word in the ROM is executed.

Cache memories frequently use valid bits to indicate which data or instruction words in the cache are valid or not valid. Adding valid bits to a cache is easy because both the valid bit and the instruction or data words use the same RAM cells. However, adding RAM bits to a ROM is not as straightforward as two different kinds of memory cells are needed. Since ROM memory is not used as temporary storage as is a cache, valid bits are not used with a ROM.

RAM CELLS INVALIDATE ROM CODE WORDS—FIG. 1

Figure 1:
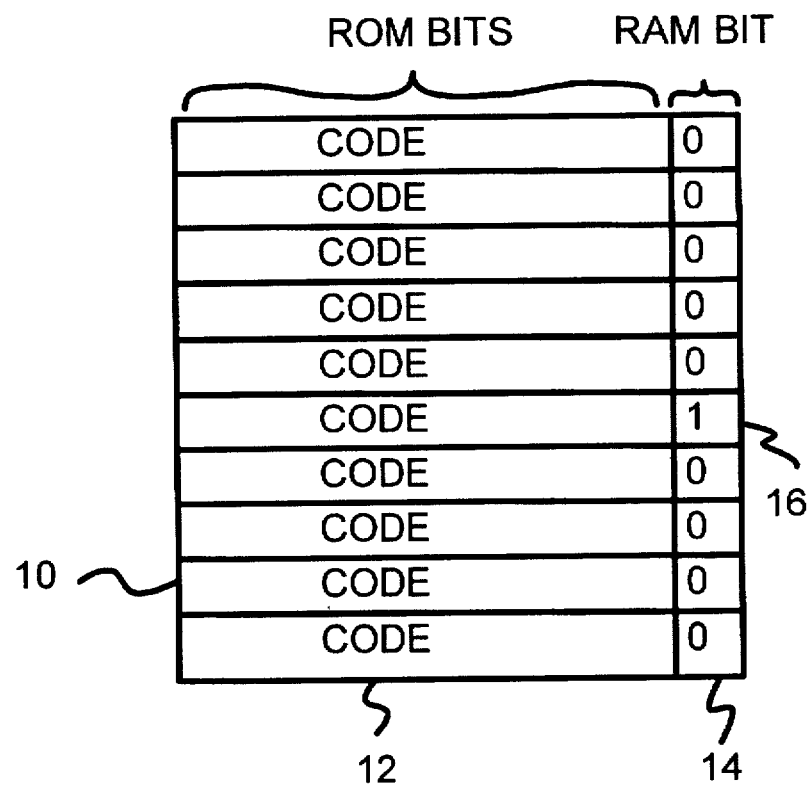
FIG. 1 shows a ROM array with integrated RAM bits for identifying code updates.

FIG. 1 shows a ROM array with integrated RAM bits for identifying code updates. Memory array 10 includes read-only memory ROM cells 12 and read-writeable random-access memory RAM cells 14. Each line or row in memory array 10 contains 32 ROM cells but only one RAM cell. The ROM cells contain one or more instructions, while the RAM cell indicates if the row's instruction is valid or has been updated with an instruction in external memory. For example, the ROM code word in row 16 is invalidated because its RAM bit is set to one. All other rows of code words are valid since their RAM bits are cleared.

The inventor has realized that a single RAM bit can be integrated into a ROM array to provide fine-granularity code patches. While a separate RAM module could be integrated on the same chip with a ROM module, separate arrays, row lines, and row decoders for the RAM and for the ROM would be used. Instead, the inventor uses the same array, with the same row decoders and drivers to drive both the ROM bits and the single RAM bit. The row line connects to both ROM memory cells and a RAM cell.

ROW LINE AND DECODER SHARED BY ROM AND RAM CELLS—FIG. 2

Figure 2:
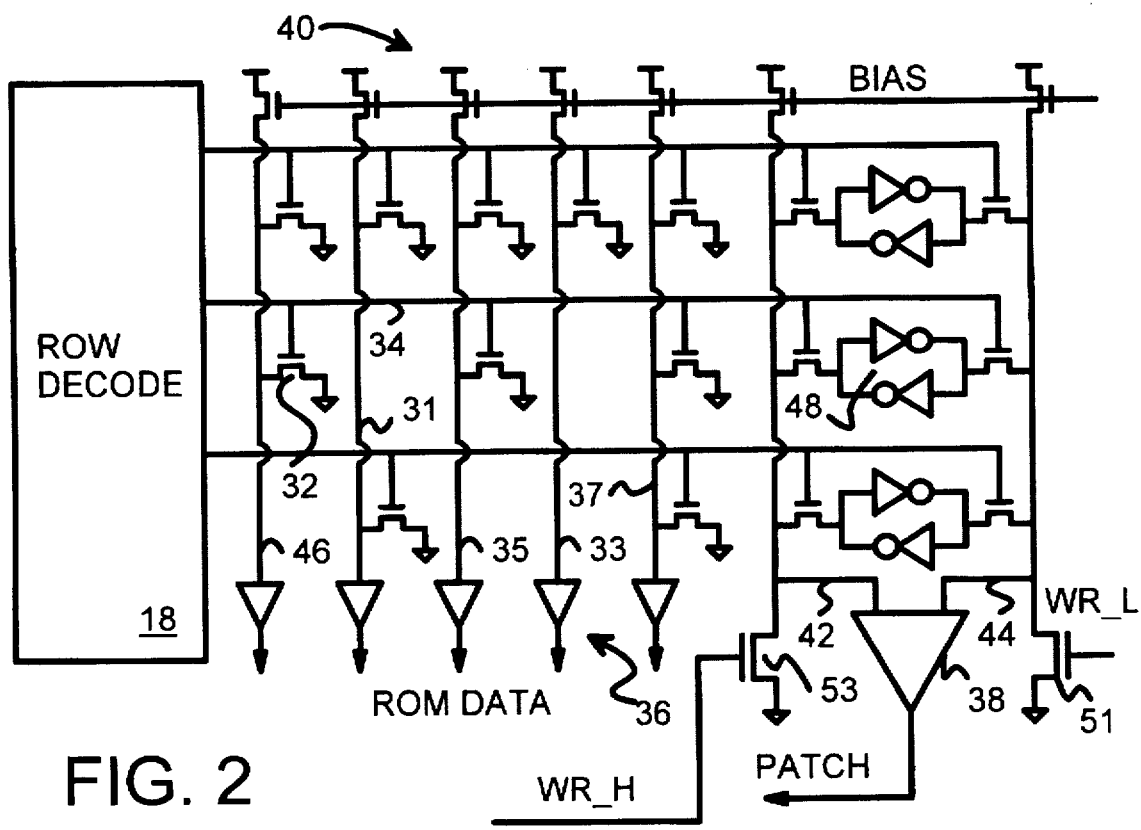
FIG. 2 shows a memory with each row line connected to both ROM cells and a RAM cell.

FIG. 2 shows a memory with each row line connected to both ROM cells and a RAM cell. A ROM cell is simply a single transistor with its gate connected to the row line and its drain connected to a bit line. When the row line has a high voltage applied, the ROM transistor turns on, pulling the bit line to a low voltage. The ROM is programmed by the presence or absence of a transistor at the crossing of the row line with each bit line.

Row decode 18 receives an address as an input (not shown), and drives one of the row lines high while driving the other row lines low. Thus only one of the row lines can be activated at any time. Row decode 18 can be constructed with a NOR gate to drive each row line, or using a NAND gate and an inverter for driving each row line. Other arrangements are possible for row decode 18. Row lines are sometimes referred to as word lines since a 16 or 32-bit word is accessed by one row in some array configurations.

Each row line connects to a word of ROM bits, 32 ROM cells. ROM cells with a ROM transistor drive bit lines low, while ROM cells without a functional transistor leave the bit lines high. Bit lines are biased high by pre-charge transistors 40 which can be left on at all times, or pulsed high between memory accesses. Using n-channel transistors for pre-charge transistors 40, bit lines are biased high to Vcc–Vtn, about 2 volts for a 3-volt power supply. An n-channel ROM transistor pulls the bit line to ground. Thus ROM sense amplifiers 36 can be simple inverters or buffers with a logical threshold of about 1 to 1.5 volts. The ROM data is thus driven out from ROM sense amplifiers 36.

At the end of each row line is a single static RAM cell. RAM cell 48 stores a single bit in a cross-coupled pair of inverters. A pair of access transistors connect the input and outputs of the cross-coupled inverters to a pair of bit lines 42, 44. When a row line is activated, the high row-line voltage turns on the access transistors, connecting the cross-coupled inverters to bit lines 42, 44. One of the bit lines is driven low by the cross-coupled inverters while the other bit line remains high. The relative size of the access transistors and the cross-coupled inverters is carefully chosen so that the bit-line charge does not accidentally flip the state of the cross-coupled inverters. Normally the access transistor is made smaller than the inverters to limit charge sharing.

Differential sense amplifier 38 senses the difference in voltage between the two bit lines and amplifies this difference, outputting a signal indicating the logical state of the RAM cell being read. The RAM cells each contain an invalid bit that indicates when the ROM word in that row is not valid but is patched in external RAM.

The RAM cells are initially written by driving one of bit lines 42, 44 high, and the other bit line low. A write driver can be as simple as a large n-channel transistor which drives one bit line low while the biasing transistors 40 keep the other bit line high. A one is written to a RAM cell by activating its row line and signaling WR_PAT_HIGH, activating write transistor 53 to pull bit line 42 low. A zero is written to the RAM cell by activating its row line and signaling WR_PAT_LOW, activating write transistor 51 to pull bit line 44 low.

During reading, both the ROM cells and the RAM cell are simultaneously read. For example, when row line 34 is decoded and activated, ROM bit line 46 is pulled to ground by ROM transitransistors cont lines 35, 37 are also pulled low by ROM transistors connected to row line 34. However, ROM bit lines 31, 33 are left high since no ROM transistor is present for these bit lines for row line 34. The ROM data read from ROM sense amplifiers 36 is thus 01010.

RAM cell 48 is also connected to row line 34. When the ROM word at row line 34 is being read, RAM cell 48 is also activated and read, driving one of bit lines 42, 44 low.

The low bit line is sensed and amplified by differential sense amplifier 38 and output as signal PATCH. When RAM cell 48 was written to the high state during initialization, PATCH is high when row line 34 is activated, indicating that the ROM word of row line 34 is not valid and a patch in external RAM should be fetched.

RAM cell 48 is preferably constructed in a small vertical pitch to match the much smaller ROM cells on row line 34. RAM cell 48 can have a wide layout since only one cell is attached to each row line. The array or ROM cells may have to be expanded somewhat in the vertical pitch to allow for the physical placement of a RAM cell in the row.

A preferred approach is to place multiple columns of RAM cells at the end of the rows or ROM cells. The bit lines for all of the multiple columns of RAM cells are connected together so there is only one logical column or RAM cells. Thus only one differential sense amp is needed. For example, a RAM cell that is three times the height of the ROM cells requires three columns of RAM cells. Thus the vertical pitch of the rows of ROM cells does not have to be expanded.

RAM BIT ENABLES EXTERNAL FETCH OF PATCHED INSTRUCTION

Figure 3:
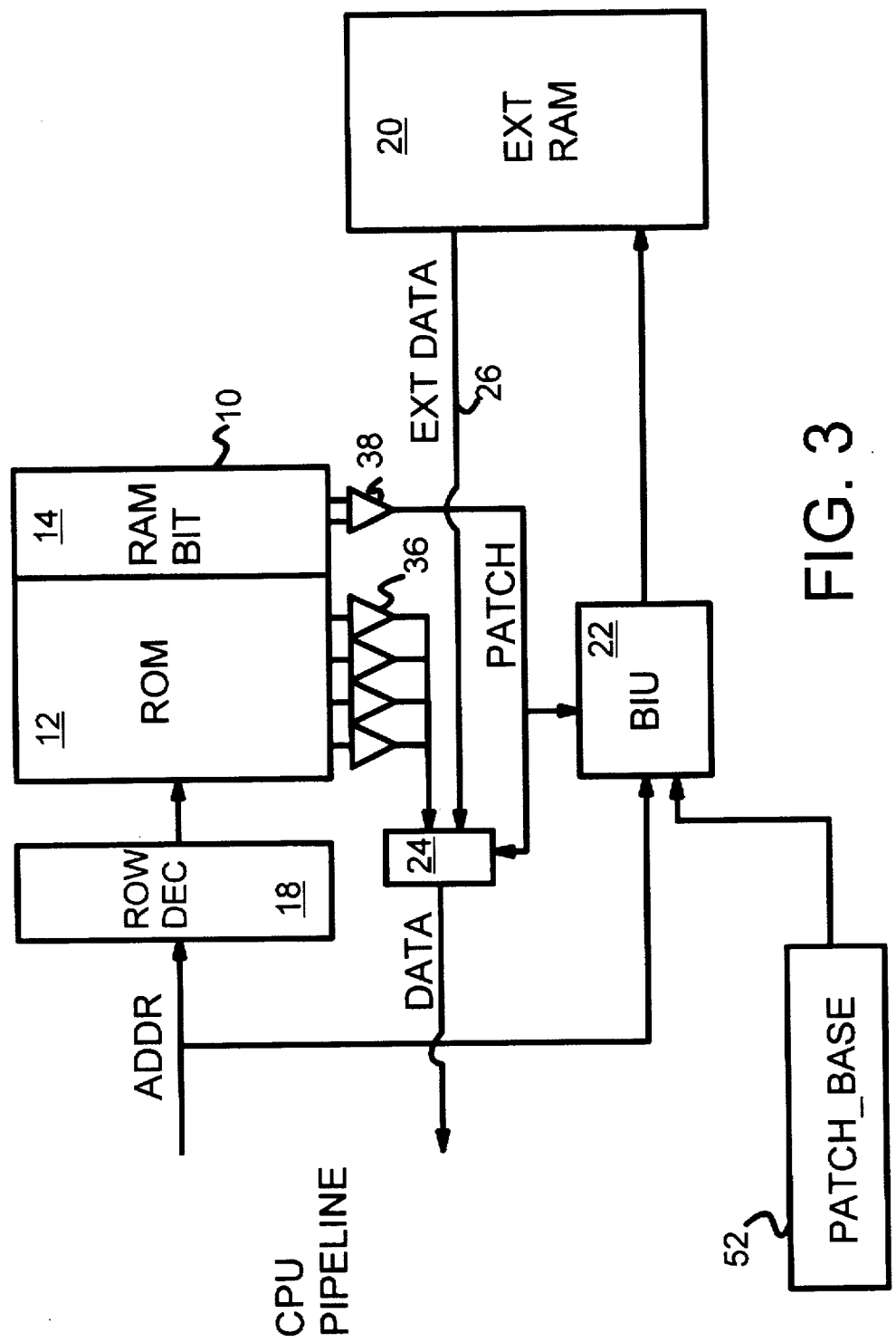
FIG. 3 is a diagram of an embedded ROM with RAM bits to activate a fetch of a code patch from external RAM.

FIG. 3 is a diagram of an embedded ROM with RAM bits to activate a fetch of a code patch from external RAM. A central processing unit (CPU's) pipeline generates addresses of instructions being fetched for execution. Addresses are pre-decoded to determine if they fall within an embedded ROM's address space. If so, the lower bits of the address are decoded by row decoder 18 and one of the rows in memory array 10 is activated. ROM cells 12 which are connected to the activated row line drive some bit lines low, and are sensed and outputted by ROM sense amplifiers 36 as a ROM code word or instruction.

When ROM cells 12 are read, a RAM cell in a column of RAM cells 14 is also read, since the RAM cell shares the same row lines as the ROM cells 12. Differential sense amplifier 38 detects the voltage difference between the two bit lines from RAM cells 14 and outputs signal PATCH. When signal PATCH is low, ROM cells 12 in the activated row are valid and have not been patched. The ROM code word output from ROM sense amplifiers 36 is selected by mux 24 and output to the CPU pipeline as the ROM's data. The CPU's pipeline then arranges the ROM data into instructions and executes the instruction obtained from the ROM. The CPU's pipeline may contain a cache or an instruction buffer, which temporarily stores the ROM data before execution.

When the RAM bit read from memory array 10 is high, signal PATCH is high. Mux 24 then blocks the ROM data from ROM sense amplifiers 36 and instead selects external RAM data from external bus 26. Signal PATCH also activates an external read cycle from bus interface unit BIU 22. BIU 22 receives the address from the CPU pipeline and normally does not generate an external memory access when the address falls within the embedded ROM's address space. However, signal PATCH over-rides the address pre-decode and causes BIU 22 to generate an external memory read cycle. BIU translates the ROM's address from the CPU pipeline to an address in external RAM 20 where ROM patches are located. The patch is read from external RAM 20 and inputted to mux 24 over external bus 26. Mux 24 selects the patched code word from external RAM 20 and transmits the patch data to the CPU pipeline rather than the ROM data.

Translation of the ROM's address to the external RAM's address can be performed in many ways, but the inventor prefers to simply replace the upper (most-significant) address bits with a base address for the patch region within external RAM 20. Patch base address register 52 supplies the upper address bits for the region within external RAM 20 where the patches are located. Thus a small portion of the system's main memory can be used for the code patches. Patch base address register 52 can be programmed with different addresses so that the patch region of memory can be re-located or assigned by the operating system.

PATCH REGION OF ADDRESS SPACE—FIG. 4

Figure 4:
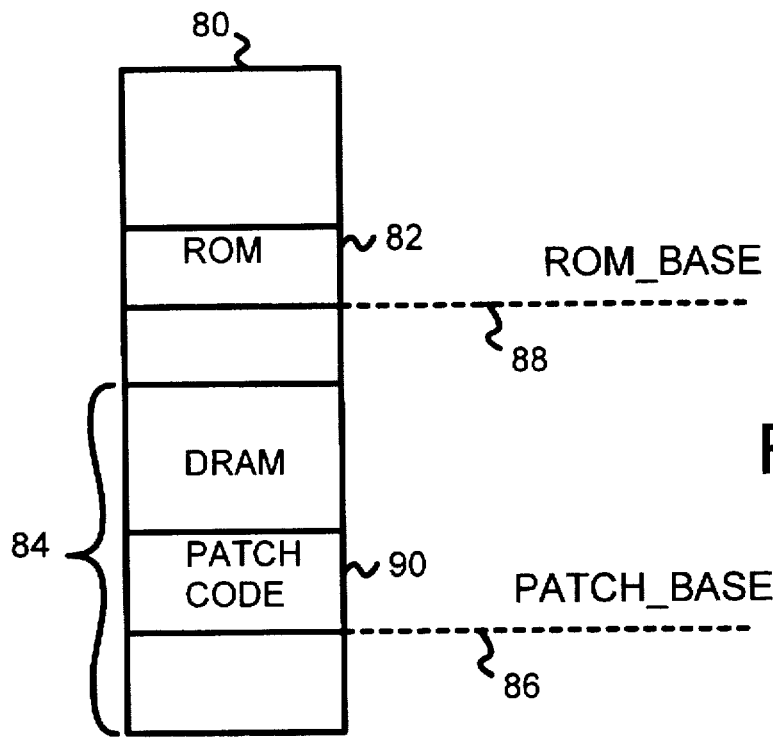
FIG. 4 is a diagram of an address space with a ROM region and a patch-code region in DRAM.

FIG. 4 is a diagram of an address space with a ROM region and a patch-code region in DRAM. Address space 80 is a 4 Gigabyte virtual address space addressable by a 32-bit physical address. Accesses to ROM are mapped to ROM region 82, while DRAM access are generated for addresses in DRAM region 84. A small part of DRAM region 84 is set aside as patch-code region 90 for code updates or patches to the code in ROM region 82.

The base or starting address of ROM region 82 is ROM base address 88. Addresses within ROM region 82 are specified as an offset within region 82, often written as base:offset. The offset is the value of the lower or least-significant address bits. The beginning of patch-code region 90 is also specified by a base address, patch base address 86. The inventor prefers to select base addresses for ROM region 82 and patch-code region 90 to be aligned to the same power of 2. In other words, each base address has the same number of upper address bits and the offsets have the same number of lower address bits. Addresses within patch-code region 90 are also specified by an offset within the region, as patch_base:offset.

SAME OFFSET USED FOR ROM INSTRUCTION AND PATCH IN RAM

The ROM's offset is used as the offset into patch-code region 90. Thus a patched instruction in ROM has its updated instruction in RAM at the same offset in patch-code region 90. Using the same offset simplifies address generation, as a vector table lookup is not required.

FETCHING UN-PATCHED ROM INSTRUCTION—FIG. 5

Figure 5:
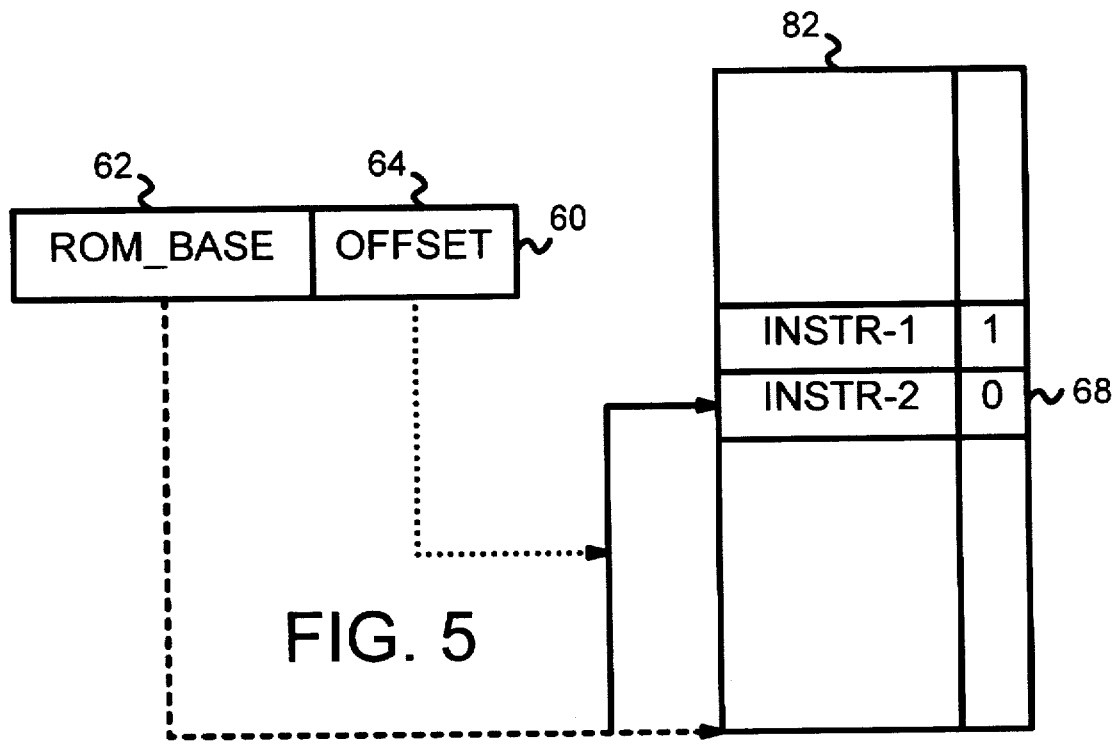
FIG. 5 is a diagram of a fetch of an instruction in ROM that has not been patched.

FIG. 5 is a diagram of a fetch of an instruction in ROM, which has not been patched. Address 60 from the CPU pipeline contains upper address bits which form the ROM base address 62, and lower address bits which form offset 64. ROM base address 62 is decoded to determine that the embedded ROM is accessed, enabling the ROM access logic and disabling DRAM access logic. ROM base address 62 corresponds to the first address in ROM region 82. Offset 64 is decoded by the row decoder to select one row in the physical ROM array that contains the desired ROM code word or instruction. Instruction 68 is thus decoded in ROM region 82. Since the RAM bit for the selected row is a zero, the ROM's instruction 68 is valid and has not been patched. Instruction 68 from the ROM is then returned to the CPU's pipeline.

FETCHING PATCHED ROM INSTRUCTION FROM EXTERNAL RAM

FIG. 6 is a diagram of fetching a single patched ROM word from external RAM. ROM region 82 is first accessed to fetch instruction 68. However, the RAM bit for the decoded row is high, indicating that instruction 68 in ROM region 82 is not valid. The external memory is instead accessed for the updated instruction.

The ROM base address 88 is translated or replaced with patch-code base address 86 by the bus interface unit. The patch-code base address is combined with the offset to generate the address of the patch word in main memory. Updated instruction 66 is fetched from patch-code region 90 of the main DRAM memory and passed to the CPU pipeline for execution. Program control is returned to the next instruction in ROM region 82, instruction 68, which is then fetched and executed.

Thus only a single row in the ROM is replaced with the updated instruction form external RAM. When the ROM's rows are one instruction wide, then single-instruction granularity is achieved. A single instruction in the ROM can be updated without changing other instructions.

FETCHING SEQUENCE OF PATCHED ROM INSTRUCTIONS FROM EXTERNAL RAM

FIG. 7 is a diagram of fetching multiple instructions from external RAM for a single instruction in ROM. ROM region 82 is first accessed to fetch instruction 110. However, the RAM bit for the decoded row is high, indicating that instruction 110 in ROM region 82 is not valid. The external memory is instead accessed for the updated instruction.

The ROM base address 88 is translated or replaced with patch-code base address 86 by the bus interface unit. The patch-code base address is combined with the offset to generate the address of the patch word in main memory. Updated instruction 100 is fetched from patch-code region 90 of the main DRAM memory and passed to the CPU pipeline for execution.

However, a more complex patch is required to fix instruction 110 in ROM. A single instruction cannot fix the problem. Instead, a sequence of instructions is necessary to fix the complex problem caused by the one ROM instruction. The instruction sequence in ROM region 82 needs to be expanded.

The ROM's offset locates just one instruction in patch-code region 90. Additional instructions for this patch cannot use adjoining locations in patch-code region 90 because other instructions in ROM region 82 might also need patches and have to use these offsets. Thus only one instruction is available in patch-code region 90.

A patch overflow region 91 is provided when additional instructions are needed for a single patch that cannot fit in the assigned offset in patch-code region 90. Instruction 100 in patch-code region 90 is a jump instruction to a longer routine in patch overflow region 91. The actual patch is contained in a sequence of instructions 102, 104, 106 in patch overflow region 91. Once the patch routine is completed, a return instruction 108 is executed, passing control back to the following instruction in ROM region 82, instruction 68, which is then fetched and executed.

A single instruction in the ROM can thus be replaced with either a single patch instruction, as shown in FIG. 6, or a series of instructions, as shown in FIG. 7. The programmer is provided a versatile method to update ROM code, using efficient, single-line updates or more lengthy routine updates as needed.

Patch overflow region 91 is also located in the main DRAM memory. Jump instruction 100 may need to be a long jump fully specifying the address of instruction 102. Patch overflow region 91 is preferably located adjacent to patch-code region 90 so that a short jump instruction can be used. While unused offsets in patch-code region 90 could be used for patch overflow region 91, this is undesirable, as future updates may need the unused offsets.

INITIALIZATION OF RAM BITS IN ROM ARRAY

The RAM bits in the ROM array must be initialized to indicate the updated code. The RAM bits can be designed to power up in the zero (unpatched) state. A first part of the ROM code that cannot be updated can be used to read a file on a hard disk that contains a list of the current updates. This list can include the bits to be written to the RAM bits in the ROM.

APPLICATIONS

The invention allows for such easy updating of ROM code that other applications are enabled. Performance analysis can use the invention to count how often certain instructions or ROM routines are executed. A performance routine which increments a counter each time the routine is called is placed in patch-code overflow memory. A RAM bit for a line in the ROM is set to invalidate the ROM line and force a jump to the external patch-code memory. Then each time the ROM line is executed, the performance routine is executed. Once performance testing is completed, the RAM bit is cleared so that the ROM line is again used. Tracing or logging routines can also be used. Debugging can be facilitated by traps implemented with the invalidated ROM lines.

ALTERNATE EMBODIMENTS

Several other embodiments are contemplated by the inventor. For example the external data can be cached in an on-chip data cache even though the external RAM is off-chip. The ROM and patch-code regions of memory do not have to be aligned to a power-of-two boundary, but then an addition may be needed to add the non-aligned base to the offset. Other biasing schemes are possible; p-channel transistors rather than n-channel biasing transistors can be substituted to increase the bias voltage for low-voltage applications. The cross-coupled inverters in the RAM cell can be standard complementary metal-oxide-semiconductor (CMOS) inverters, or the pull-up p-channel transistors can be replaced with resistors.

The term "RAM" is somewhat of a misnomer, since read-only memories are also randomly accessible by address. The term RAM has come to mean a read-writeable memory while a ROM is readable but not writeable. The ROM cell is programmed during chip manufacturing by the presence or absence of a functional transistor at the intersection of a ROM bit line and a row line. A ROM cell is programmed off by either the complete absence of the ROM transistor, or by disabling the ROM transistor, such as by deleting a critical part of the ROM transistor, such as a metal contact or connection.

The number of ROM bits in each row line can vary. While 32 ROM bits per row are preferred, other sizes such as 16, 64, 128, or 256 are also contemplated. The wider rows have an advantage of easier layout, but when only one RAM bit is shared for a wide row, then the granularity is coarser and additional code must be located in the external RAM for updates. The computer's instruction size can also vary from 32 bits. The various signals and bits can be inverted. Multiple RAM bits could be used to encode additional information, such as to select one of several patch areas of memory. The column of RAM cells can be physically placed at the end of the row lines or at the beginning of the row lines near the row decoder, or at an intermediate location on the row lines. Placing the RAM cells near the row decoder may speed up RAM access by having a reduced row-line delay.

For large ROM's, the address space occupied by the patch memory can be excessive. The patch memory can be compressed to save memory space. Multiple entry points in the ROM can be mapped to the same address entry point in the patch memory. For example, the 2 or more of the address bits of the ROM offset can be ignored when determining the offset to the external patch memory. Code-path analysis can be used to ensure that no two updated ROM instructions map to the same patch-memory address. The ROM code can alternately be aligned to ensure that two patched instructions do not map to the same patch address. A branch-and-link instruction can also be used to store the entry address from the ROM and map all patches to the same entry address in external patch memory.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. An embedded memory comprising:

a plurality of read-only memory (ROM) bit lines and pair of random-access-memory (RAM) bit lines;

a plurality of row lines, each row line in the plurality of row lines coupled to a plurality of ROM cells, each row line also coupled to a RAM cell, the RAM cell being readable and writeable, but the ROM cells being readable but not writeable;

a row decoder receiving an address offset, the row decoder for decoding the address offset to select and activate a selected row line in the plurality or row lines;

a plurality of ROM sense amplifiers for outputting a ROM code word, each ROM sense amplifier receiving one of the ROM bit lines as an input and outputting a bit in the ROM code word; and a differential sense amplifier, coupled to amplify a small voltage difference across the pair of RAM bit lines, the differential sense amplifier outputting a patch-enable signal indicating that the ROM code word has been patched and is not valid, whereby each row line is connected to both ROM cells and a RAM cell, the RAM cell indicating when the ROM cells contain an invalid ROM code word.

2. The embedded memory of claim 1 wherein a ROM cell is located at each intersection of a ROM bit line and a row line, and wherein a RAM cell is located at each intersection of the pair of RAM bit lines and a row line; and wherein each ROM cell is manufactured either with or without a functional ROM transistor, the ROM transistor having a gate connected to a row line and a drain connected to a ROM bit line and a source connected to a constant-voltage supply, whereby ROM cells are programmed at manufacture by the presence or absence of the functional ROM transistor.

3. The embedded memory of claim 2 wherein the constant-voltage supply is ground, and wherein the ROM transistor is an n-channel metal-oxide semiconductor (MOS) transistor, and wherein the selected row line is activated by the row decoder driving a high voltage onto the selected row line to enable functional ROM transistors to conduct current from the ROM bit lines to ground.

4. The embedded memory of claim 3 wherein each RAM cell comprises:

a cross-coupled pair of inverters for storing a bit of data;

a pair of pass transistors, each pass transistor coupled to conduct current between one of the pair of RAM bit lines and the cross-coupled pair of inverters in response to control gates, the control gates connected to a row line, whereby each row line is coupled to gates of ROM transistors and the control gates of the pair of pass transistors in a RAM cell.

5. The embedded memory of claim 4 wherein each pass transistor is an n-channel MOS transistor.

6. The embedded memory of claim 5 further comprising:

biasing means, coupled to each ROM bit line and to the pair of RAM bit lines, for applying a bias voltage to each ROM bit line and to the pair of RAM bit lines, wherein the ROM sense amplifiers and the differential sense amplifier sense a voltage change from the bias voltage.

7. The embedded memory of claim 6 further comprising:

write means, coupled to the pair of RAM bit lines, for writing either a one or a zero logical value to the RAM cell coupled to the selected row line, the write means driving one of the pair of RAM bit lines low to write to the RAM cell.

8. The embedded memory of claim 7 wherein each ROM cell and each ROM sense amplifier connect to only one ROM bit line, whereby ROM sensing is single-ended while RAM sensing is differential.

9. The embedded memory of claim 8 further comprising:

an external-memory interface, responsive to the patch-enable signal from the differential sense amplifier, for fetching an updated code word from an external memory when the patch-enable signal indicates that the ROM code word is not valid, whereby the updated code word is fetched from the external memory when the RAM cell indicates that the ROM code word is not valid.

10. The embedded memory of claim 9 further comprising:

a translator, receiving an address including the address offset and a ROM base address, for translating the ROM base address to a patch-code base address in the external memory, the translator generating an external address as the patch-code base address combined with the address offset, the translator outputting the external address to the external memory interface, wherein the address offset is not translated but the ROM base address is translated.

11. A microprocessor with an embedded read-only instruction memory, the microprocessor comprising:

a central processing unit (CPU) core for executing instructions;

an embedded memory for storing read-only instructions, the embedded memory having row lines connected to read-only-memory ROM cells storing an instruction for execution by the CPU core;

random-access-memory RAM cells, connected to the row lines in the embedded memory, for storing valid bits for the instructions stored in the ROM cells, a valid bit stored in a RAM cell connected to a selected row line indicating when the instruction stored in the ROM cells connected to the selected row line are not valid;

external-memory interface means, coupled to an external memory, for fetching an updated instruction from the external memory when the valid bit indicates that the instruction stored in the ROM cells for the selected row line is not valid; and multiplexer means, coupled to the external memory interface and coupled to the embedded memory, for transmitting the updated instruction from the external memory when the valid bit indicates that the instruction from the selected row line is not valid, but transmitting the instruction from the ROM cells connected to the selected row line when the valid bit indicates that the instruction is valid, whereby the valid bit indicate when the instruction in the ROM cells is not valid and the updated instruction is fetched from the external memory.

12. The microprocessor of claim 11 further comprising:

a row decoder, receiving an address of the instruction from the CPU core, the row decoder decoding an offset portion of the address and activating the selected row line in the embedded memory when a base address portion of the address matches a ROM base address, whereby the row decoder activates the ROM cells and a RAM cell coupled to the selected row line.

13. The microprocessor of claim 12 further comprising:

a translator, coupled to receive the address of the instruction from the CPU core, for translating the base address portion of the address to an external base address of a patch-code portion of the external memory containing the updated instruction, the translator outputting the external base address portion and the offset portion to the external memory interface means, wherein the updated instruction is fetched at a same offset from a base address as the instruction in the embedded memory.

14. The microprocessor of claim 13 wherein the embedded memory further comprises:

ROM bit lines and a pair of RAM bit lines;

a differential sense amplifier, receiving the valid bit from the RAM bit lines, for outputting a patch-enable signal by amplifying a small voltage difference between the pair of RAM bit lines;

ROM sense amplifiers, each ROM sense amplifier receiving one ROM bit line and outputting one bit of the instruction;

wherein a ROM cell is located at each intersection of a ROM bit line and a row line and a RAM cell is located at each intersection of the pair of RAM bit lines and a row line.

15. The microprocessor of claim 14 wherein the ROM cell in a first logical state comprises a functional n-channel MOS transistor having a gate connected to a row line and a drain connected to a ROM bit line and a source connected to a constant voltage and wherein a ROM cell in a second logical state opposite the first logical state comprises an absence of a functional transistor.

16. The microprocessor of claim 15 wherein the RAM cell comprises a storage element and a pair of pass transistors, each pass transistor having a gate connected to a row line and a drain connected to a RAM bit line and a source connected to the storage element.

17. The microprocessor of claim 16 wherein the pair of pass transistors in the RAM cell are n-channel MOS transistors.

18. The microprocessor of claim 17 wherein the external memory is a main system memory comprising dynamic RAM.

19. A method of fetching instructions from an embedded read-only memory (ROM) and updated instructions from an external memory, the method comprising the steps of:

generating a fetch address from a processor pipeline, the fetch address having a base portion and an offset;

decoding the base portion of the fetch address and generating an access to the embedded read-only memory when the base portion is a first address in the embedded read-only memory;

decoding the offset of the fetch address and selecting a selected row line in the embedded read-only memory;

reading selected read-only cells connected to the selected row line and outputting a ROM code word stored in the selected read-only cells;

simultaneously reading a writeable cell coupled to the selected row line, the writeable cell storing a valid bit for the ROM code word stored in the selected read-only cells;

transferring the ROM code word to the processor pipeline when the valid bit indicates that the ROM code word is valid;

when the valid bit indicates that the ROM code word is not valid:
  translating the base portion of the fetch address to an external base portion, the external base portion being a first address in a patch-code portion of the external memory;
  concatenating the external base portion with the offset to form an external address;
  transmitting the external address to the external memory and reading an updated code word at the external address;
  transferring the updated code word to the processor pipeline rather than the ROM code word;

whereby the ROM code word is replaced by the updated code word from the external memory in response to the valid bit connected to the row line.

20. The method of claim 19 further comprising the steps of:

detecting when the updated code word is a jump instruction to a patch routine in the external memory;

fetching instructions in the patch routine in the external memory and transmitting the instructions to the processor pipeline;

detecting an end of the patch routine and requesting a next fetch address from the processor pipeline;

whereby the ROM code word is replaced by the patch routine of instructions in external memory when the updated code word is the jump instruction.

* * * * *